United States Patent [19]

Inoue

[11] Patent Number: 5,097,438

[45] Date of Patent: Mar. 17, 1992

[54] DYNAMIC ELECTRIC SIGNAL OUTPUT CIRCUIT

[75] Inventor: Michiya Inoue, Hino, Japan

[73] Assignee: Fanuc, Ltd., Minamitsuru, Japan

[21] Appl. No.: 309,553

[22] PCT Filed: Jun. 17, 1988

[86] PCT No.: PCT/JP88/00599

§ 371 Date: Apr. 17, 1989

§ 102(e) Date: Apr. 17, 1989

[87] PCT Pub. No.: WO88/10465

PCT Pub. Date: Dec. 29, 1988

[30] Foreign Application Priority Data

Jun. 19, 1987 [JP] Japan .................... 62-151238

[51] Int. Cl.$^5$ .................... G06F 3/00; G06F 11/32
[52] U.S. Cl. .................... 395/800; 364/926.9;
364/926.91; 364/927.5; 364/927.92;
364/927.93; 364/927.99; 364/952.9; 364/952;
364/DIG. 2; 395/775
[58] Field of Search ........ 364/518, 521, 200 MS File,
364/900 MS File

[56] References Cited

U.S. PATENT DOCUMENTS

| | | | |
|---|---|---|---|
| 3,902,082 | 8/1975 | Proebsting | 307/279 |
| 4,150,441 | 4/1979 | Ando | 365/190 |
| 4,403,287 | 9/1983 | Blahut et al. | 364/200 |
| 4,858,190 | 8/1989 | Yamaguchi et al. | 365/189.05 |

FOREIGN PATENT DOCUMENTS 55-030741 of 1980 Japan .
55-088113 of 1980 Japan .
55-150437 of 1980 Japan .
57-157324 of 1982 Japan .

Primary Examiner—Kevin A. Kriess
Attorney, Agent, or Firm—Staas & Halsey

[57] ABSTRACT

Electric signal output equipment that does not require circuits to hold signals in a static manner, that is small in size, and that is cheaper to produce is disclosed. This includes m groups of ON-OFF signal reading, holding and outputting circuits (3mn) including n elements therein, m groups of displays (4mn) including n elements therein, n data buses (9n) connected with the aforementioned circuits (3mn) and (4mn), and a control circuit (1) for cyclically outputting m read commands (Wm) and m display commands (Dm) in synchronization with each other to cause the aforementioned ON-OFF signal reading, holding and outputting circuit (3mn) each of which is provided a signal holding circuit (74) which holds a signal for the time being (during a period until the following ON-OFF signal is applied) and to cause the aforementioned display (4mn) to keep displaying for the time being (during a period until the following ON-OFF signal is applied) due to the residual image phenomenon, thereby the ON-OFF signals are continuously output and displayed without using a static signal holding means such as a latch.

4 Claims, 3 Drawing Sheets

DYNAMIC ELECTRIC SIGNAL OUTPUT CIRCUIT

TECHNICAL FIELD OF THE INVENTION

This invention relates to an improvement applicable to electric signal output equipment; and more particularly to an improvement applicable to electric signal output equipment employable for reading a plurality of binary signals out of a memory and for outputting the signals to a computer or the like, after such binary signals are converted to ON-OFF signals.

BACKGROUND OF THE INVENTION

FIG. 1 illustrates an example of electric signal output equipment available in the prior art and which is employable for reading a plurality of binary signals out of a memory and for outputting the signals to a computer or the like, after such binary signals are converted to ON-OFF signals. Referring to FIG. 1, numerals 1, 2 and 5m respectively indicate a control circuit, a memory and a plurality of latches. The plurality of latches 5m are grouped or divided into m groups. Only 3 groups are illustrated in FIG. 1. Each group of the latches 5m has n elements, although only 4 elements are illustrated for each group. Numeral 6mn indicates a plurality of output driver circuits. These driver circuits 6mn are also grouped into m groups (only 3 groups are illustrated in the drawing), and each group of the output driver circuits 6mn is connected with the corresponding group of the latches 5m, which group has n elements (only 4 elements are illustrated in the drawing). Numeral 4mn indicates a plurality of displays, of which the total quantity equals to the product of "m" and "n". They are also grouped into m groups (only 3 groups are illustrated in the drawing), and each group of the displays 4mn is connected with the corresponding group of the latches 5m, which group has n elements. Each group of the displays 4mn is also connected with the corresponding group of the driver circuits 6mn, which group has n elements.

In the aforementioned electric signal output equipment available in the prior art, binary signals are consecutively read out of the memory 2 into the designated address of the latches 5m, in response to a group of commands (The combination of a group of address commands A and a read-out command R) issued by the control circuit 1. Since a latch has a static nature or holds a signal until another signal is applied and replaces the former signal, the designated address of the latches 5m continuously outputs the signal latched therein to a computer or the like (not shown) through the corresponding one of the driver circuits 6mn. Incidentally, the designated address of the latches 5m causes the corresponding one of the displays 4mn to continuously work, during the period in which the designated address of the latches 5m holds a signal.

The aforementioned electric signal output equipment available in the prior art is designed to allow each address of the latches 5m to operate cyclically. In other words the latest signals are applied to a computer or the like virtually on an on-line basis and the ON-OFF position of the signals which are currently being applied to the computer or the like are displayed on the corresponding displays. Thus, the signals are displayed during the period in which such signals are being applied to the computer or the like. However, the necessary quantity of the latches 5m, the driver circuits 6mn and the displays 4mn equals "mxn" or the product of the quantity "n" of the elements included in each group of the latches etc. and the quantity "m" of the groups of the latches etc., which equal to the total quantity of the output circuits. This causes a drawback in which the necessary quantity of the elements of the latches 5m becomes identical to that of the output circuits, resultantly requiring a large space and large amount of production cost.

OBJECTS OF THE INVENTION

The object of this invention is to remove the aforementioned drawback and to provide electric signal output equipment which requires no latches and which has advantages that the electric signal output equipment is small in size, requires small space and has a low production cost.

To achieve the above object, electric signal output equipment in accordance with this invention is provided with a control circuit (1) which cyclically outputs address commands (A) and read-out commands (R) m times per unit length of time, a memory means (2) which cyclically outputs ON-OFF signals to data buses (9n) whose quantity is "n", in response to a combination of each of the address commands (A) and each of the read-out commands (R), a plurality of ON-OFF signal reading, holding and outputting means (3mn), of which the total quantity corresponds to the product of "m" and "n", is grouped into m groups each of which groups has n elements therein and is connected with each of the data buses (9n), and each of which ON-OFF signal reading, holding and outputting means (3mn) is provided at least a switching means (71), a signal picking-up means (72) which picks up the aforementioned ON-OFF signal in response to the switching means (71), a signal holding means (74) and a signal output means (76), and each of which means (3mn) reads, holds and outputs the ON-OFF signals which currently exist on the data buses (9n) in response to a read command (Wm) which is cyclically output by the control circuit (1) m times per unit length of time slightly later than each of the address commands (A) and the read-out commands (R), a plurality of switches (8m) of which the total quantity is "m" and each of which works in response to a display command (Dm) which is cyclically output by the control circuit (1) m times per unit length of time in synchronization with the read command (Wm) which is also cyclically output by the control circuit (1) m times per unit length of time slightly later than each of the address commands (A) and the read-out commands (R), and a plurality of displays (4mn) of which the total quantity corresponds to the product of "m" and "n", and is grouped into m groups each of which groups has n elements therein and is connected with each of the data buses (9n), and each of which displays the ON-OFF position of the ON-OFF signals which currently exist on each of the data buses (9n) whose quantity is "n", in response to each of the switching means (8m) whose quantity is "m".

The structure and the resultant function of the electric signal output equipment of this invention will be described below.

a. Each of the ON-OFF signal reading, holding and outputting means 3mn whose total quantity is the product of "m" and "n" and each of the displays 4mn whose total quantity is also the product of "m" and "n" are respectively grouped into m groups each of which groups includes n elements.

b. All the ON-OFF signal reading, holding and outputting means $3mn$ and all the displays, are connected with a plurality of data buses $9n$ whose quantity is "n". In this case, the number in each group of the ON-OFF signal reading, holding and outputting means $3mn$ and of the displays $4mn$ is selected to be identical to the number of the data buses $9n$ whose quantity is "n". In other words, the first element of each group of the ON-OFF signal reading, holding and outputting means $3mn$ and the first element of each group of the displays $4mn$ are connected with the first one of the data buses $9n$ whose quantity is "n". The other elements are connected in the same manner.

c. Since the control circuit 1 cyclically outputs address commands (A) and read-out commands (R) m times per unit length of time, each of the data buses $9n$ cyclically receives an ON-OFF signal corresponding to the number of the designated one of the data buses $9n$ or the address of the address command (A).

d. A plurality of read commands Wm and a plurality of display commands Dm are simultaneously applied on a cyclical basis m times per unit length of time to cause the ON-OFF signal reading, holding and outputting means $3mn$ to read, hold and output consecutively each of the ON-OFF signals which currently exists on the corresponding data buses $9n$.

e. Since each of the ON-OFF signal reading, holding and outputting means $3mn$ is provided a signal holding means 74 for the purpose to hold a signal for the time being (during a period until the following ON-OFF signal is applied.) and since the displays $4mn$ maintain the display due to the residual image, each set of the ON-OFF signals is output to a computer or the like and the ON-OFF position thereof is displayed on the displays $4mn$, virtually on a continuous basis, without using a means for holding signals on the static basis, such as a latch.

BRIEF DESCRIPTION OF THE DRAWINGS

A more detailed description will be presented below for an embodiment of the electric signal output equipment in accordance with this invention, referring to the drawings tabulated below.

DETAILED DESCRIPTION OF PREFERRED EMBODIMENT

Figure 1:
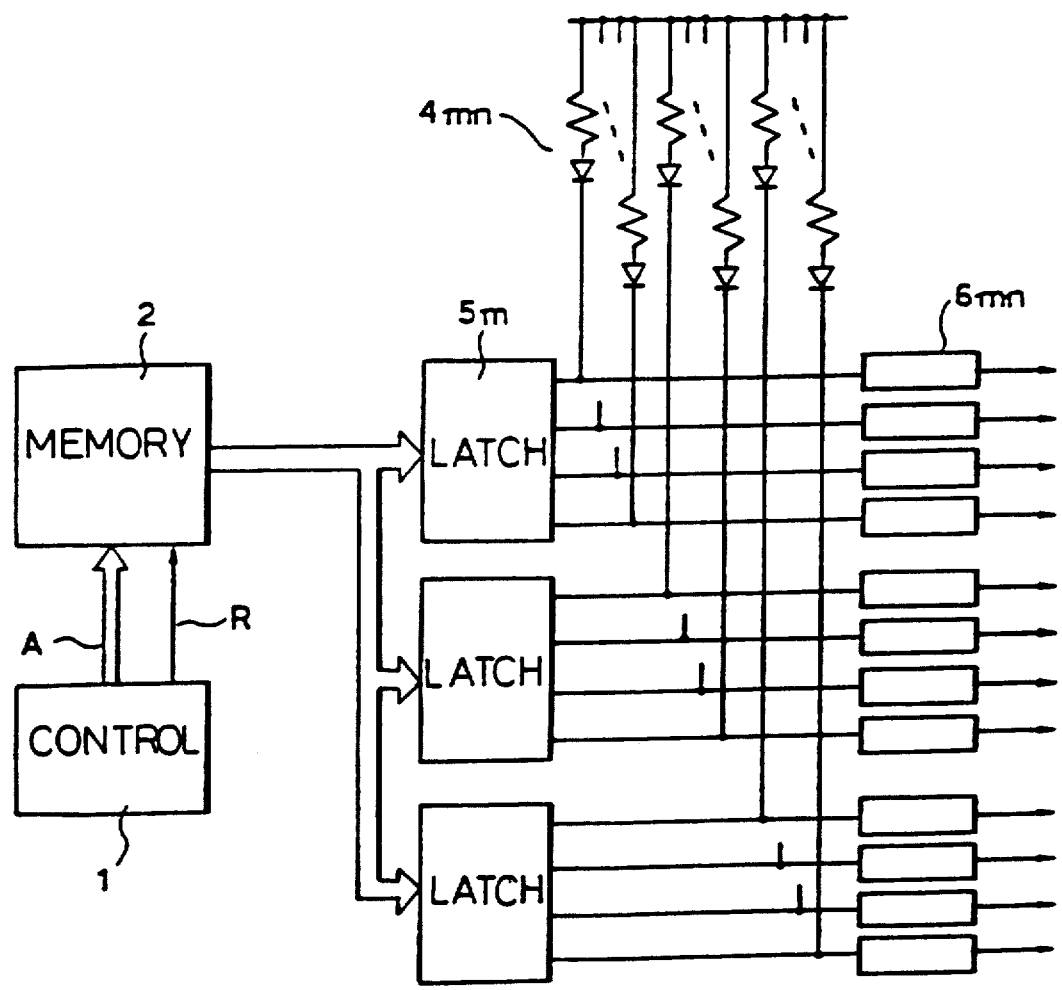
FIG. 1 is a block diagram of electric signal output equipment available in the prior art.
Figure 2:
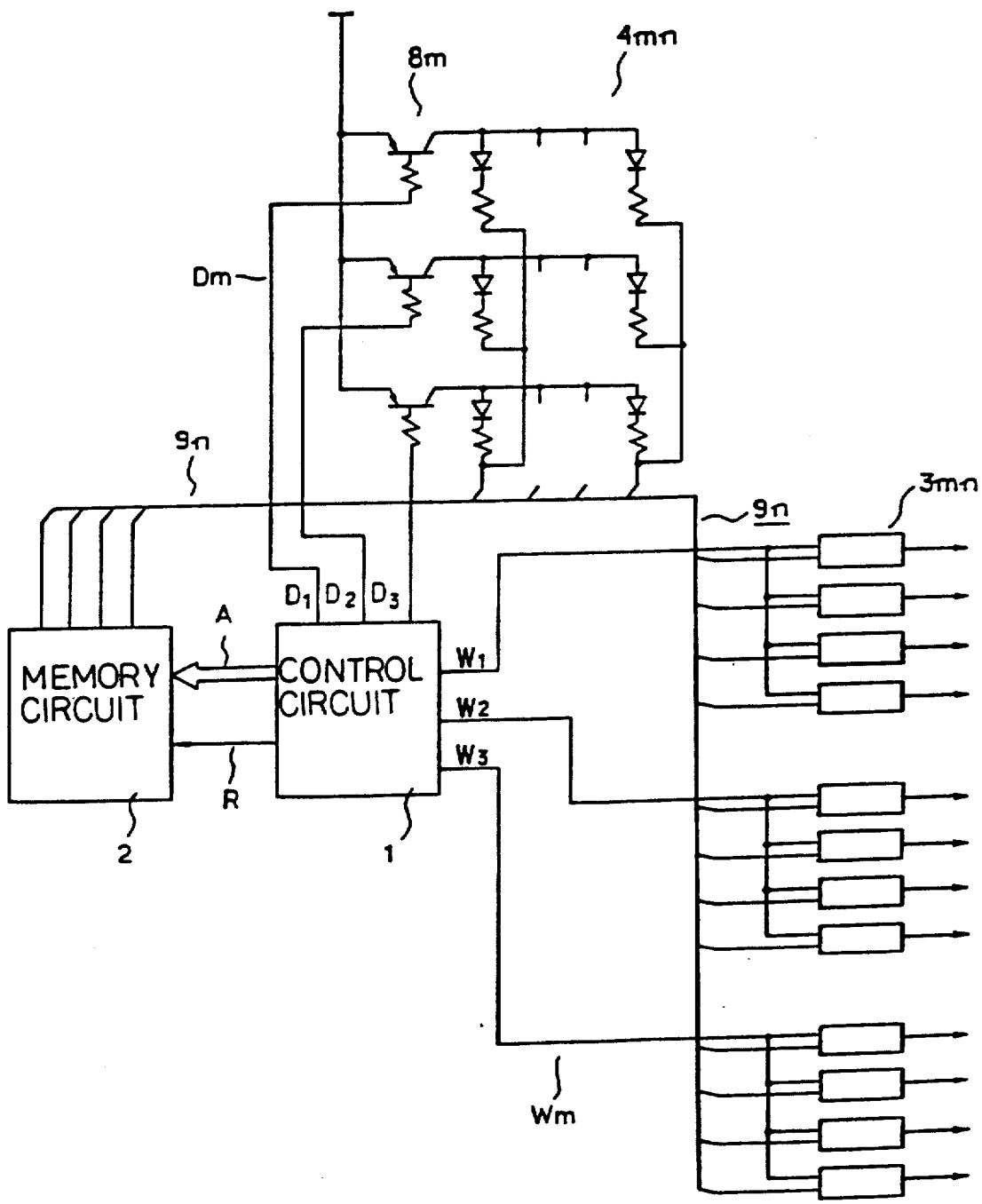
FIG. 2 is a block diagram of electric signal output equipment in accordance with one embodiment of this invention.
Figure 3:
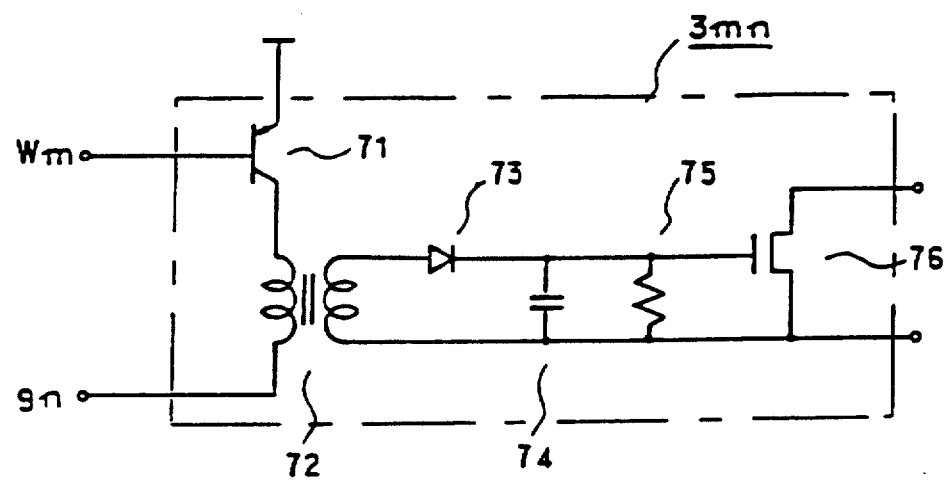
FIG. 3 is a block diagram of an element of an ON-OFF signal reading, holding and outputting means $3mn$, one of the essential components of electric signal output equipment in accordance with this invention.

FIG. 2 illustrates a block diagram of electric signal output equipment in accordance with one embodiment of this invention. FIG. 3 illustrates a block diagram of an element of ON-OFF signal reading, holding and outputting means $3mn$, which is one of the essential components of the electric signal output equipment in accordance with one embodiment of this invention. In the figures, the numeral 1 designates a control circuit which outputs address commands (A) comprising n addresses and read-out commands (R) m times per unit length of time to a memory 2 and allows the memory means 2 to output n independent groups of ON-OFF signals therefrom to a plurality of data buses $9n$ whose quantity is "n" (only 4 buses are illustrated in the drawing).

Referring to FIG. 3, numeral $3mn$ designates an ON-OFF signal reading, holding and outputting means. FIG. 3 shows a switching means 71 as a transistor. A signal picking up means 72 is shown in FIG. 3 as which picks up an ON-OFF signal in response to the ON-OFF position of the switching means 71, and reference numeral 73 a diode. FIG. 3 shows a signal holding means 74 as a capacitor or the like, a resistor 75, and a signal outputting means 76 as a transistor or the like. The ON-OFF signal reading, holding and outputting means $3mn$ are grouped into m groups, and each group has n elements. Each element of each group of the ON-OFF signal reading, holding and outputting means $3mn$ is connected with a corresponding one of the data buses $9n$.

In FIG. 2, numeral $4mn$ designates a plurality of displays, of which the total quantity is grouped into m groups, and each group has n elements.

In response to the read commands Wm which are issued m times per unit length of time, and each of which is applied to each of the m independent groups of the ON-OFF signal reading, holding and outputting means $3mn$, the corresponding one of the ON-OFF signal reading, holding and outputting means $3mn$ picks up n independent units of the ON-OFF signals which currently exist on the data buses $9n$. Although these commands have a "once-through" nature, since the read commands Wm whose quantity is "m" are refreshed cyclically every several hundred milli seconds. Since the ON-OFF signal reading, holding and outputting means $3mn$ include a signal holding means 74, this means maintains the signal during the aforementioned several hundred milli seconds in a non-static or dynamic manner. Thus, the ON-OFF signal reading, holding and outputting means $3mn$ (is allowed to keep outputting) outputs the signals virtually on the continuous basis.

In response to the display commands Dm which are issued m times per unit length of time and each of which is applied to each of the m independent groups of the switching means $8m$ in synchronization with the read commands Wm, the corresponding one of the switching means $8m$ becomes conductive. Thus, each element of the displays $4mn$ which are connected with the aforementioned switching means $8m$, is lit or unlit, depending on the ON-OFF position of the signal existing on the corresponding one of the data buses $9n$ at the instant when the aforementioned display command Dm is applied.

Because the display commands Dm are applied by the control means 1 cyclically every several hundred milli seconds, and because of the human eye residual image phenomenon, the displays $4mn$ appear as if they are continuously lit.

As was described above, the electric signal output equipment in accordance with this invention is provided a plurality of ON-OFF signal reading, holding and outputting means $3mn$. The number of the means $3mn$ corresponds to the product of "m" and "n". A number of displays $4mn$ corresponding to the product of "m" and "n" are grouped into m groups; each group includes n elements. The means $3mn$ and displays $4mn$ operate cyclically m times per unit length of time in synchronization with each other. As a result the ON- OFF signal reading, holding and outputting means 3mn are allowed to continuously output ON-OFF signals. This is due to the function of the signal holding means 74 which actually is a capacitor or the like included in the means 3mn. The displays 4mn are allowed to continuously display the ON-OFF position of the output ON-OFF signals based on the residual image phenomenon in a dynamic manner, without employing any static element e.g. a latch or the like. This structure achieves various advantages wherein the electric signal output equipment is small in size and is less expensive in production cost.

The quantity of the elements included in each of the m groups is not required to be a single number or "n". In other words, some groups are allowed to include n1 elements e.g. 4 elements and the other groups are allowed to include n2 elements e.g. 2 elements.

The above description has clarified that this invention has successfully provided an electric signal output equipment, wherein:

(1) each of the ON-OFF signal reading, holding and outputting means 3mn whose total quantity is the product of "m" and "n" and each of the displays 4mn whose total quantity is also the product of "m" and "n" are respectively grouped into m groups each of which groups includes n elements, (2) each of the ON-OFF signal reading, holding and outputting means 3mn included in each group and each of the displays 4mn included in each group is respectively connected with each one of the plurality of data buses 9n whose quantity is "n", (3) the control circuit 1 cyclically outputs address commands (A) and read-out commands (R) m times per unit length of time, thereby each of the data buses 9n cyclically an ON-OFF signal corresponding to the number of the designated one of the data buses 9n or the designated address of the address commands (A) applied thereto, (4) a plurality of read commands Wm and a plurality of display commands Dm are simultaneously applied on a cyclical basis m times per unit length of time to cause the ON-OFF signal reading, holding and outputting means 3mn to read, hold and output consecutively each of the ON-OFF signals which currently exists on the corresponding one of the data buses 9n, and (5) each of the ON-OFF signal reading, holding and outputting means 3mn is provided a signal holding means 74 for the purpose to hold a signal for the time being (during a period until the following ON-OFF signal is applied.) in a dynamic manner and the displays 4mn are allowed to maintain the display in a dynamic manner due to the residual image phenomenon, thereby each set of the ON-OFF signals is allowed to be output to a computer or the like in a dynamic manner and the current ON-OFF position of each set of the ON-OFF signals is allowed to be displayed in a dynamic manner, virtually on the continuous basis, without using a means for holding signals on the static basis, such as a latch.

Although this invention has been described with reference to a specific embodiment, this description is not meant to be construed in a limiting sense. In addition to the disclosed embodiment and/or modifications to be assumed based on the disclosed embodiment, the other embodiments will become apparent to persons skilled in the art upon reference to the description of this invention. It is therefore contemplated that the claim will cover any such embodiments and/or modifications as fall within the true scope of this invention.

I claim:

1. Electric signal output equipment comprising:

control circuit means for cyclically outputting address commands, read-out commands, read commands and display commands "m" times per unit length of time;

memory means connected to said control circuit means;

at least "n" data buses operatively connected to said memory means;

means in said memory means for cyclically outputting ON-OFF signals to said data buses in response to said address commands and said read-out commands;

a first number of ON-OFF signal reading, holding and outputting means connected to said data buses for sensing, dynamically holding and outputting the ON-OFF signals, in response to said read commands from said control circuit means, the first number corresponding to the product of "m" and "n";

at least "m" switches operatively connected to said control circuit means and to switch in response to said display commands; and a plurality of display means respectively coupled to corresponding ones of said switches, for displaying the ON-OFF signals which currently exist on said data buses.

2. Electric signal output equipment according to claim 1, wherein each of said reading, holding and outputting means comprises:

a switch connected to switch a potential in response to a corresponding one of said read commands;

signal picking-up means for sensing one of said ON-OFF signals in response to said potential being switched by said switch;

dynamic signal holding means for dynamically holding said one of said ON-OFF signals; and signal output means for outputting a signal indicative of said dynamically held one of said ON-OFF signals.

3. Electric signal output equipment according to claim 2, wherein said control circuit means includes:

means for outputting said read commands later than said read-out commands.

4. Electric signal output equipment according to claim 3, wherein said dynamic signal holding means comprises a capacitor.

* * * * *